(12) United States Patent
Forster

(10) Patent No.: US 10,657,334 B2
(45) Date of Patent: May 19, 2020

(54) RFID DEVICES CONFIGURED FOR DIRECT INTERACTION

(71) Applicant: Avery Dennison Corporation, Mentor, OH (US)

(72) Inventor: Ian James Forster, Essex (GB)

(73) Assignee: AVERY DENNISON CORPORATION, Glendale, CA (US)

( * ) Notice: Subject to any disclaimer, the term of this patent is extended or adjusted under 35 U.S.C. 154(b) by 0 days.

(21) Appl. No.: 14/107,560

(22) Filed: Dec. 16, 2013

(65) Prior Publication Data

US 2014/0176307 A1 Jun. 26, 2014

Related U.S. Application Data

(60) Provisional application No. 61/737,164, filed on Dec. 14, 2012.

(51) Int. Cl.
*G06K 7/10* (2006.01)
*G06K 19/073* (2006.01)
*H03K 17/96* (2006.01)

(52) U.S. Cl.
CPC ... *G06K 7/10009* (2013.01); *G06K 19/07345* (2013.01); *H03K 17/96* (2013.01); *H03K 17/9618* (2013.01)

(58) Field of Classification Search
CPC .......... G06K 7/10009; G06K 19/0716; G06K 19/0719; G06K 19/072; G06K 19/0721;
(Continued)

(56) References Cited

U.S. PATENT DOCUMENTS 6,340,931 B1 * 1/2002 Harrison .............. G06K 7/0008
235/385
6,828,902 B2 * 12/2004 Casden ................ G06K 7/0008
340/10.3
(Continued)

FOREIGN PATENT DOCUMENTS

EP 1418536 5/2004
EP 1876556 1/2008
(Continued)

OTHER PUBLICATIONS

Yo-Ping Huang, Shan-Shan Wang and Zheng-Hong Deng, *An Interactive RFID-based Multi-touch Product Display System*, Department of Electrical Engineering, National Taipei University of Technology, Taipei 10608, Taiwan.
(Continued)

*Primary Examiner* — Stephen R Burgdorf
(74) *Attorney, Agent, or Firm* — Avery Dennison Retail Information Services, LLC

(57) ABSTRACT

An RFID tag is provided with an RFID chip and an antenna and interactive switch electrically coupled to the RFID chip. When a user physically interacts with the switch (such as by pressing the switch with a finger), the antenna transmits an input signal to an RFID reader of an RFID-based control system. The RFID reader, in turn, transmits a control signal to an electronic device for controlling the device. The RFID tag may be incorporated into any of a number of devices, such as a keyboard or article of clothing, and can function to operate a variety of electronic devices, including audio-visual devices and gaming systems.

9 Claims, 8 Drawing Sheets

(58) Field of Classification Search
CPC ......... G06K 19/0723; G06K 19/07345; G06K 19/0739; G06K 19/07746; G06F 3/0202; G06F 3/0231; H01H 2300/032; H03K 17/96; H03K 17/9618
USPC ...... 340/10.4, 10.5, 5.62, 10.1, 572.1, 572.4
See application file for complete search history.

(56) References Cited

U.S. PATENT DOCUMENTS

| | | | |
|---|---|---|---|
| 6,863,220 B2 | 3/2005 | Selker | |
| 6,903,662 B2* | 6/2005 | Rix | G06F 3/0202 340/10.6 |
| 7,113,087 B1* | 9/2006 | Casebolt | G01V 3/101 340/539.1 |
| 7,172,115 B2 | 2/2007 | Lauden | |
| 7,176,799 B1 | 2/2007 | Golicz et al. | |
| 7,298,266 B2 | 11/2007 | Forster | |
| 7,315,908 B2* | 1/2008 | Anderson | G06F 3/02 340/10.1 |
| 7,387,233 B2 | 6/2008 | Masuta | |
| 7,394,346 B2* | 7/2008 | Bodin | G06F 3/017 340/10.1 |
| 7,394,403 B2 | 7/2008 | Winkler et al. | |
| 7,493,336 B2 | 2/2009 | Noonan | |
| 7,508,316 B1 | 3/2009 | Arrar | |
| 7,535,424 B2* | 5/2009 | Henty | G06F 3/0231 343/702 |
| 7,567,780 B2 | 7/2009 | August et al. | |
| 7,586,397 B2 | 9/2009 | Bayley et al. | |
| 7,741,970 B2 | 6/2010 | Cunningham et al. | |
| 7,748,608 B2 | 7/2010 | Tanner et al. | |
| 7,782,202 B2 | 8/2010 | Downie et al. | |
| 7,928,965 B2 | 4/2011 | Rosenblatt et al. | |
| 7,982,609 B2 | 7/2011 | Padmanabhan et al. | |
| 7,994,920 B2 | 8/2011 | Hatfield et al. | |
| 8,061,622 B2 | 11/2011 | Nielsen et al. | |
| 8,279,039 B2* | 10/2012 | Thorn | G06F 3/04883 340/5.51 |
| 9,415,689 B2* | 8/2016 | Waller | B60K 35/00 |
| 2003/0069806 A1 | 4/2003 | Konomi | |
| 2006/0197676 A1 | 9/2006 | Smith | |
| 2006/0255127 A1 | 11/2006 | Woods | |
| 2007/0011138 A1 | 1/2007 | Boucard | |
| 2007/0057790 A1* | 3/2007 | Alden | G06F 3/0202 340/572.1 |
| 2007/0057792 A1* | 3/2007 | Alden | G06F 3/0202 340/572.1 |
| 2007/0085690 A1 | 4/2007 | Tran | |
| 2007/0194100 A1* | 8/2007 | Plassky | G06K 19/0704 235/375 |
| 2007/0200679 A1* | 8/2007 | Colby | H01Q 1/2225 340/10.51 |
| 2007/0200680 A1 | 8/2007 | Colby | |
| 2007/0285229 A1* | 12/2007 | Batra | G06K 19/0707 340/539.26 |
| 2008/0006696 A1* | 1/2008 | Piersol | G06K 19/07381 235/451 |
| 2008/0094215 A1 | 4/2008 | Amador et al. | |
| 2008/0297323 A1* | 12/2008 | Barkan | G08C 23/04 340/10.31 |
| 2008/0303638 A1 | 12/2008 | Nguyen et al. | |
| 2009/0166616 A1* | 7/2009 | Uchiyama | H01L 29/7869 257/43 |
| 2009/0167484 A1 | 7/2009 | Burr | |
| 2009/0179742 A1* | 7/2009 | Takeshima | G01V 15/00 340/10.1 |
| 2009/0231109 A1 | 9/2009 | Reichert et al. | |
| 2009/0234472 A1 | 9/2009 | Pyle | |
| 2009/0322537 A1 | 12/2009 | Tapp et al. | |
| 2010/0004062 A1 | 1/2010 | Maharbiz et al. | |
| 2010/0026465 A1* | 2/2010 | Gravelle | H04Q 9/00 340/10.1 |
| 2010/0026723 A1* | 2/2010 | Nishihara | G06F 3/04886 345/671 |
| 2010/0060452 A1 | 3/2010 | Schuster et al. | |
| 2010/0171586 A1* | 7/2010 | Park | G06K 19/0717 340/5.1 |
| 2010/0277320 A1* | 11/2010 | Gold | G06K 19/07749 340/572.1 |
| 2010/0277321 A1 | 11/2010 | McElwaine et al. | |
| 2010/0308964 A1 | 12/2010 | Ackley et al. | |
| 2011/0012727 A1* | 1/2011 | Pance | G06F 13/4068 340/505 |
| 2011/0079641 A1 | 4/2011 | Cantor | |
| 2011/0128223 A1 | 6/2011 | Lashina et al. | |
| 2011/0285534 A1* | 11/2011 | Seo | G05B 19/042 340/572.1 |
| 2012/0062381 A1 | 3/2012 | Liu et al. | |
| 2012/0280800 A1* | 11/2012 | Chauvet | G06K 19/0716 340/10.51 |
| 2013/0033364 A1* | 2/2013 | Raz | G06K 19/0716 340/10.1 |
| 2014/0092069 A1* | 4/2014 | Bentov | G06F 1/26 345/179 |
| 2014/0152425 A1* | 6/2014 | Valentine | G06F 3/00 340/10.51 |

FOREIGN PATENT DOCUMENTS

| | | | |
|---|---|---|---|
| EP | 1965325 | 9/2008 | |
| EP | 2228763 | 9/2010 | |
| EP | 2302578 | 3/2011 | |
| EP | 2333701 | 6/2011 | |
| GB | 2461334 A * | 1/2010 | ........... G06F 3/0216 |
| GB | 2464362 | 4/2010 | |
| JP | 2007-264869 | 10/2007 | |
| KR | 100973084 | 7/2011 | |
| WO | 2006074096 | 7/2006 | |
| WO | 2008088984 | 7/2008 | |
| WO | 2008134381 | 11/2008 | |
| WO | 2009085777 | 7/2009 | |

OTHER PUBLICATIONS

Huber, B. Rose, *No more virtual pickpocketing of credit cards, thanks to new tap and pay technology*, University of Pittsburgh, public release date Feb. 17, 2012.

Nisha, Faizul, Bakhshi, Samar Iqbal and Ali, Naushad, *RFID System : A Boon for Librarians*, p. 549-557, 4th International Convention CALIBER-2006, Gulbarga, Feb. 2-4, 2006.

Bainbridge, Rachel M., *HCI Gesture Tracking Using Wearable Passive Tags*, Department of Electrical Engineering and Computer Science, Massachusetts Institute of Technology, Aug. 20, 2010.

Marquardt, N., Taylor, A.S., Villnar, N., and Greenberg, S. (2009) Rethinking RFID: Awareness and Control for Interation With RFID Systems. Report 2009-944-23, Department of Computer Science, university of Calgary, Calgary, AB, Canada T2N 1N4.

Sample, A.P., Student Member, IEEE, Yeager, D.J., Student Member, IEEE, and Smith, J.R., Member, IEEE, 2009, *A Capacitive touch Interface for Passive RFID Tags*, IEEE International Conference on RFID.

Riekki, J., and Salminen, T. University of Oulu, and Alakarppa, I. University of Lapland, *Requesting Pervasive Services by Touching RFID Tags*.

Valkkynen, P., Korhonen, I., Plomp, J., Tuomisto, T., Cluitmans, L., Ailisto, H., and Seppa, H., *A user interaction paradigm for physical browsing and near-object control based on tags*, VTT Information Technology, Sep. 8, 2008.

Marquardt, N., Taylor, A.S., Villnar, N., and Greenberg, S., *Visible and Controllable RFID Tags*, CHI 2010: Media Showcase Session 3, Apr. 10-15, Atlanta, GA, USA.

Hardy, R., Rukzio, E., Holleis, P., and Wagner, M., *Mobile Interaction with Static and Dynamic NFC-based Displays*, Sep. 7-10, 2010, Lisbon, Portugal.

Klompmaker, F., Fischer, H., and Jung, H., *Authenticated Tangible Interaction using RFID and Depth-Sensing Camera*, C-Lab, Uni-

(56) References Cited

OTHER PUBLICATIONS versity of Paderborn, Paderborn, Germany, ACHI 2012 : The Fifth International Conference on Advances in Computer-Human Interaction, Copyright IARIA, 2012, ISBN: 978-1-61208-177-9.

Thomas, B.H., Smith, M., Simon, T., Park, Jun , Park, Joonsuk, Von Itzstein, G.S., and Smith, R.T., *Glove-Based Sensor Support for Dymanic Tangible Buttons in Spatial Augmented Reality Design Environments*, 2011 15th Annual International Symposium on Wearable Computers.

Shintani, N., Nagaoka, H., Ohtani, C., Oda, Y., and Yoshie, O., *Virtual Switch by Augmented Reality and RFID Technologies*, Graduate School of Information, Production and Systems, Waseda University, 2-7, Hibikino, Wakamatsu-ku, Kitakyusyu, Japan, 19th Annual International Conference on Production Research.

Spassova, L., Kahl, G., and Kruger, A., *User-adaptive Advertisement in Retail Environments*, DFKI GmbH, Campus D3 2, 66123 Saarbrucken, Germany {Spassova,Gerrit.Kahl,Krueger}@dfki.de, http://www.dfki.de/irl.

Vaculik, J., Kolarovszki, P., and Tengler, J., *Transport Units Identification intheTransmission Processes in Postal Sector Through RFID Technology*, Presented at the 11th International Conference "Reliability and Statistics in Transportation and Communication", Oct. 19-22, 2011, Riga, Latvia, p. 317-326.

Konomi, S., *Personal Privacy Assistants for RFID Users*, University of Colorado, Presented at International Workshop Series on RFID, Nov. 10, 2004, Tokyo, Japan. [http://www.slrc.kyushu-u.ac.jp/rfid-workshop/].

Sanchez, I., Riekki, J., and Pyykkonen, M., *Touch & Control: Interacting with Services by Touching RFID Tags*, Dept. of Electrical and Infromation Enginnering and Infotech Oulu, Iniversity of Oulu and University of Lappand, Department of Industrial Design.

Pering, T., Ballagas, R., and Want, R., *Spontaneous Marriages of Mobile Devices and Interactive Space*, Communications of the ACM, Sep. 2005/vol. 48, No. 9, pp. 53-59.

Najera, P. and Lopez, J., Member, IEEE, *Real-time location and inpatient care systems based on passive RFID*, pp. 1-12.

So, S., The University of Queensland, Australia, *RFID, an Emerging Wireless Technology for Sustainable Customer Centric Operations*, pp. 137-154.

Czeski, A., Koscher, K., and Kohno, T.—University of Washington, and Smith, J.—Intel Research Seattle, *RFIDs and Secret Handshakes: Defending Against Ghost-and-Leech Attacks and Unauthorized Reads with Context-Aware Communications*.

Philipose, M., Fishkin, K., and Perkowitz, M.—Intel Research Seattle; Patterson, D., Fox, D., and Kautz, H.—University of Washington, and Hahnel, D. University of Freiburg, *Inferring Activities from Interactions with Objects*, Pervasive computing, Published by the IEEE CS and IEEE ComSoc 1536-1268/04 2004, pp. 10-17.

Philipose, M., Fishkin, K., Perkowitz, M., Patterson, D., and Hahnel, D., *The Probabilistic Activity Toolkit: Towards Enabling Activity-Aware Computer Interfaces*, Nov. 2003 IRS-TR-03-013.

Simon, T., Smith, R.T., Thomas, B., Von Itzstein, S., Smith, M., Park, Jun , and Park, Joonsuk, *Merging Tangible Buttons and Spatial Augmented Reality to SupportUbiquitous Prototype Designs*, Proceedings of the Thirteenth Australian User Interface Conference (AUIC2012), Melbourne, Australia.

Harrison, C., Schwarz, J. and Hudson, S.E., Human-Computer Interaction Institute and Heinz College Center for the Future of Work Carnegie Mellon University, *TapSense: Enhancing Finger Interactionon Touch Surfaces*.

Gao, J., *Intelligent and InterativePackage Based on RFID and WSN*, Licentiate Thesis, KTH—Royal Institute of Tecnology, Stockholm, Sweden, Feb. 2001.

Paradiso, J.A., Hsiao, K., and Benbasat, A., *Tangible Music Interfaces Using Passive Magnetic Tags*, Responsive Environments Group MIT Madia Laboratory, Cambridge, MA.

Ward, M., van Kranenburg, R., and Backhouse, G., *RFID: Frequency, standards, adoption and innovation*, JISC Technology and Standards Watch, May 2006.

Ibrahim, W., Osman, A., and Talib, A., *Child Positioning System Using RFID for Shopping Complexes*, EHAC'10 Proceedings of the 9th WSEAS international conference on Electronics, hardware, wireless and optical communication, ISSN: 1709-5117, ISBN:978-960-474-155-7, 2010.

International Search Report and Written Opinion dated Apr. 7, 2014 for International Application No. PCT/US2013/075374 filed Dec. 16, 2013.

International Preliminary Report on Patentability and Written Opinion dated Jun. 16, 2015 for International Application No. PCT/US2013/075374 filed Dec. 16, 2013.

Zheng, M., Deriving Activity from RFID Detection Records in an Assisted Living Context, A dissertation submitted to Auckland university of Technology, 2008.

\* cited by examiner

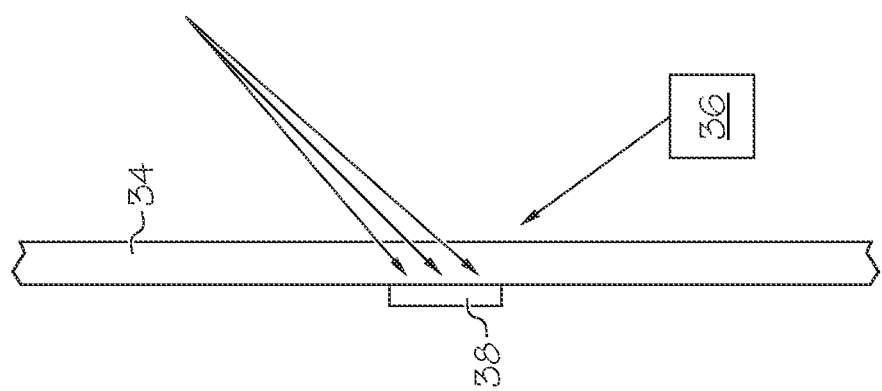
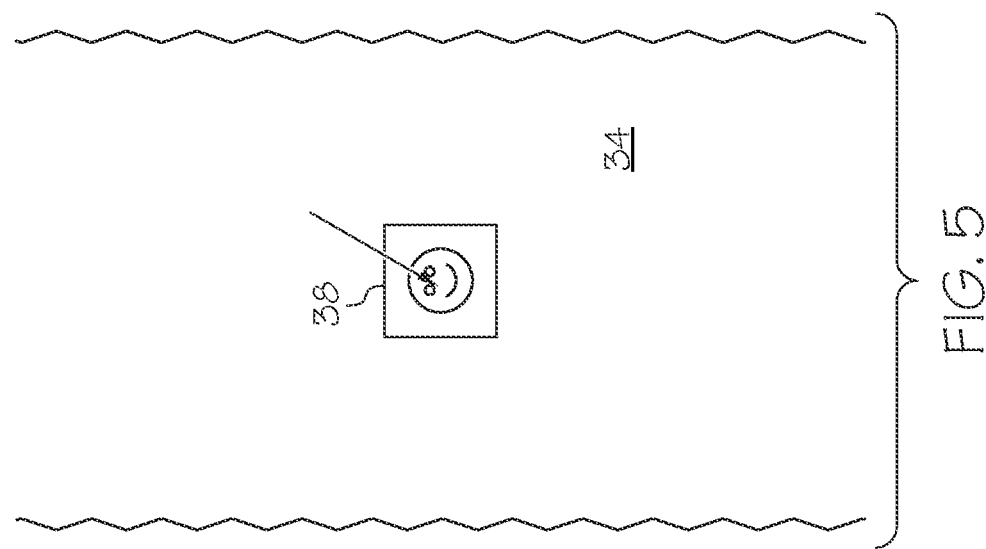

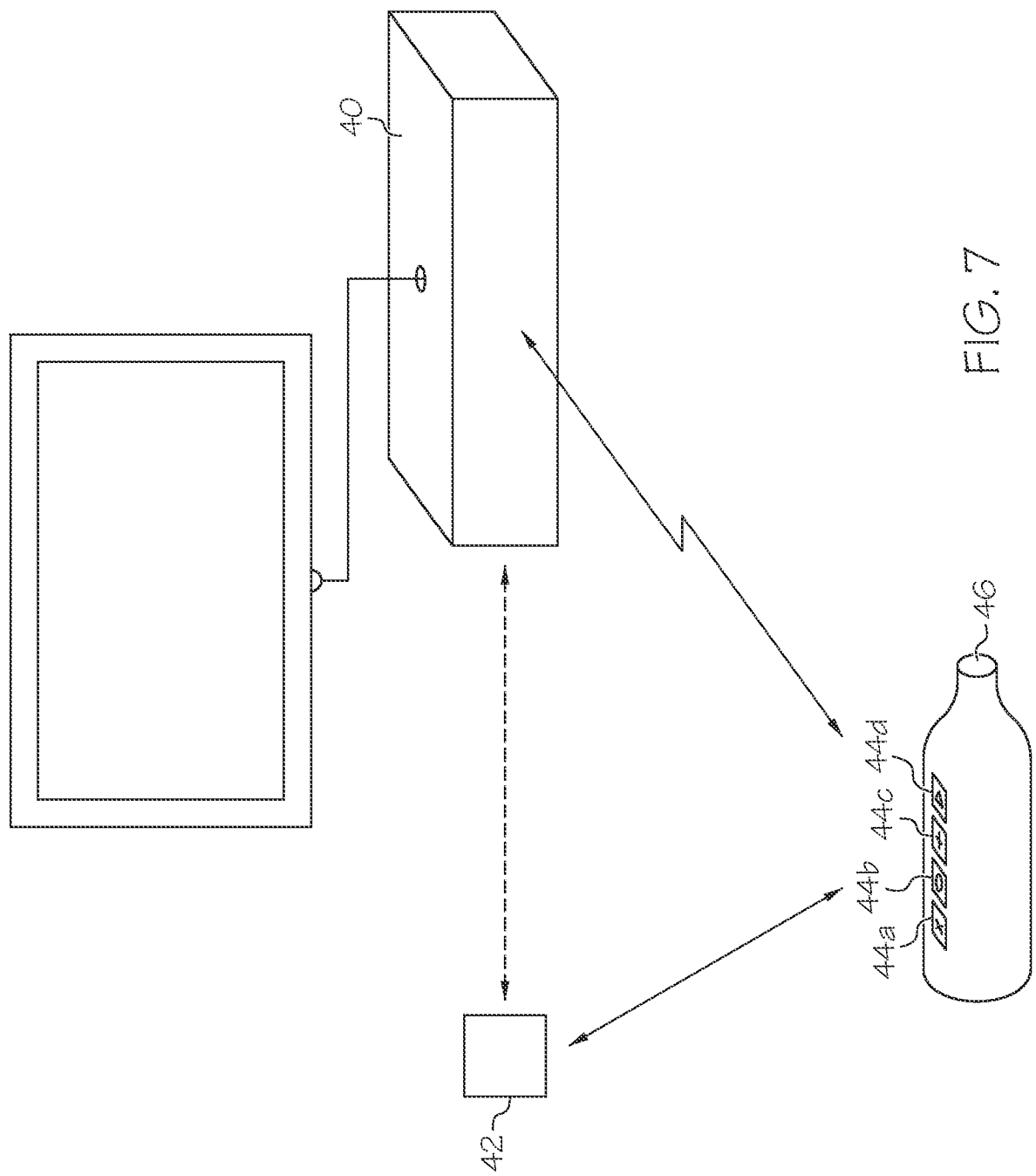

RFID DEVICES CONFIGURED FOR DIRECT INTERACTION

FIELD OF THE DISCLOSURE

The present subject matter relates to radio frequency identification ("RFID") devices. More particularly, the present subject matter relates to RFID devices configured to transmit a signal upon human contact.

DESCRIPTION OF RELATED ART

It is known to employ wireless devices for the transfer of data and/or the remote control of other devices. One disadvantage of many known wireless devices is their relatively high power usage, which can require the frequent replacement or recharging of their power sources (e.g., batteries). Furthermore, while some existing wireless devices may have some flexibility in their functionality, they are typically inflexible in their structure and configuration. Thus, a user is required adjust to the configuration of the device, rather than the device being readily modified to a configuration that is preferred by the user. Other disadvantages may include the opacity, large size, and high cost of known wireless devices. Accordingly, it would be advantageous to provide wireless devices that overcome one or more of the disadvantages of known wireless devices.

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as set forth in the claims appended hereto.

In one aspect, a RFID tag includes a RFID chip and an antenna and interactive switch electrically connected to the RFID chip. The antenna is configured to return a modified signal to an RFID reader when a user physically interacts with the interactive switch. Physical interaction does not necessary imply physical touching or contact as the interaction can occur within a certain distance.

In another aspect, a RFID-based control system is provided for controlling an electronic device. The system includes a RFID reader and a RFID tag. The RFID reader is configured to transmit a control signal to an electronic device upon receiving an input signal. The RFID tag includes a RFID chip and an antenna and interactive switch electrically connected to the RFID chip. The antenna is configured to transmit an input signal to the RFID reader when a user physically interacts with the interactive switch.

In yet another aspect, a method is provided for controlling an electronic device. The method includes providing an RFID tag comprising an interactive switch. The interactive switch is physically interacted with, and an input signal is transmitted from the RFID tag to an RFID reader in response to the physical interaction. A control signal is transmitted from the RFID reader to an electronic device in response to the input signal being transmitted.

BRIEF DESCRIPTION OF THE DRAWINGS

FIGS. 5 and 6 illustrate an alternative electronic graphic display device incorporating RFID devices of the type shown in FIG. 1;

FIG. 7 is a perspective view of an electronic gaming system incorporating RFID devices of the type shown in FIG. 1;

DESCRIPTION OF THE ILLUSTRATED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
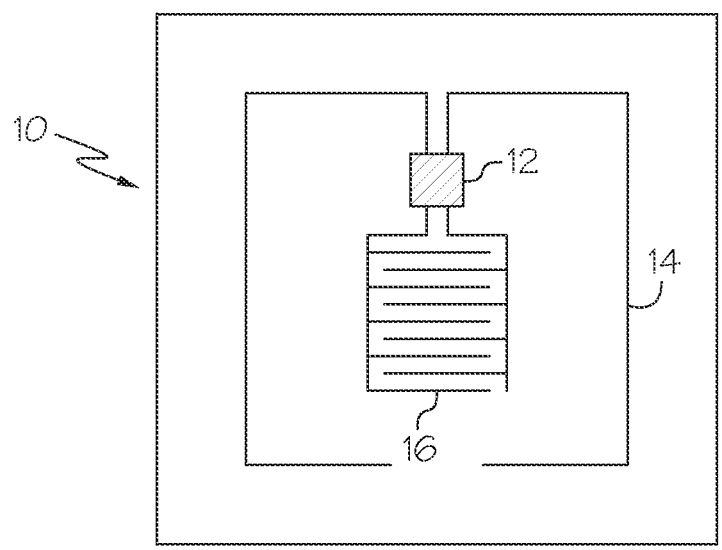
FIG. 1 is a schematic diagram of the basic structure of an RFID device embodying aspects of the present disclosure.

FIG. 1 shows the basic structure of one embodiment of an RFID tag or device 10 (which may be a passive tag or device) according to an aspect of the present disclosure. In the embodiment of FIG. 1, the RFID tag 10 comprises an RFID chip 12, with an antenna 14 and an interactive or touch-sensitive sensor or switch 16 electrically connected to the RFID chip 12. The RFID tag 10 is configured to interact with an RFID reader 18 (FIG. 2), by receiving signals from the reader 18 and/or transmitting signals to the reader 18. The antenna 14 is the component of the RFID tag 10 that transmits signals (e.g., UHF signals) to the RFID reader 18, while the RFID chip 12 determines the nature of the signals transmitted by the antenna 14.

Element 16 in FIG. 1 may also be an antenna configured to operate a different frequency than the frequency of operation of the RFID tag (e.g. UHF), such as a coil for 13.56 MHz (HF) and other low frequency magnetic signals, or a small dipole or patch for signals in the 2.45 GHz band. The received signal from the interaction is detected by chip 12, or, alternatively, an external additional component such as diode is used to convert the signal into a voltage or current, and the magnitude of that voltage or current is assessed by chip 12 to determine whether an interactive event is happening or not.

The switch 16 is operative to determine when signals are transmitted by the antenna 14. In particular, the switch 16 is configured to detect and be actuated by an interactive process from an individual, such as a human's appendage (e.g., a digit, such as a finger) being brought into contact with or in proximity to the switch 16. The aspect of the physical interaction that actuates the switch 16 may vary. For example, the switch 16 may be configured to actuate only upon application of a minimum pressure or force. In another embodiment, the switch 16 may be configured to actuate only upon a capacitive interaction that closes or completes an open circuit. In yet another embodiment, the switch 16 may be configured to actuate only upon an interaction that raises the temperature of the switch 16. Other types of switches that are responsive to an interactive process from an individual, including a human person, may also be employed without departing from the scope of the present disclosure.

It should be understood that the term "physical interaction" also includes that there is no requirement for physical touching or contact within a certain distance of the interactive point. Physical interaction with the switch can occur for example by either the person or by some object carried by or attached to the person. The interaction with the switch could be the 'switch' detecting an electric, magnetic, optical (visual or infra-red) or electromagnetic emission from the device, for example the 13.56 MHz field from a phone/tablets NFC transceiver or the 2.45 GHz emission from its Wi-Fi or Bluetooth transceiver.

When there is no physical interaction with the switch 16 (or in a default condition), the RFID tag 10 may be in a non-transmitting or passive state, in which no signal is transmitted from the antenna 14 to the RFID reader 18. Alternatively, the RFID tag 10 may be in a signal-transmitting state, after having been polled by a RFID reader, but may be prevented from transmitting a particular signal (referred to herein as an "input signal") to the RFID reader 18. When an actuating interaction has been applied to the switch 16 (which may be either a persistent or transitory interaction), the switch 16 may operate to place the RFID tag 10 in a signal-transmitting state in which the antenna 14 transmits an input or modified signal to the RFID reader 18.

For example, if a reader system is polling a given population of passive tags every 20 milliseconds, and further assuming that the switch is of a type that only changes state when it is being interacted with, then if the user interacts between polling intervals, the changed or modified code indicating the switch is closed will not be received until the tag is polled, and the user must still be interacting at the time of polling.

Figure 2:
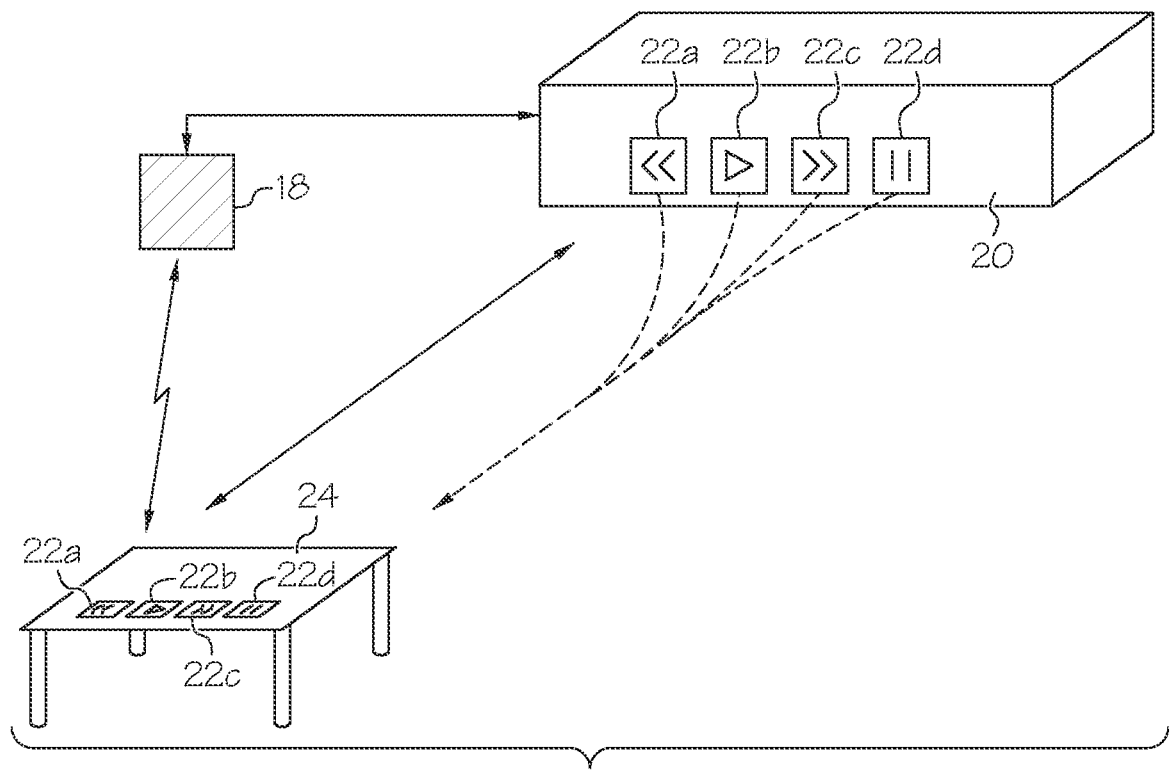
FIG. 2 is a perspective view of an electronic device incorporating RFID devices of the type shown in FIG. 1.

When the RFID reader 18 receives the input signal from the RFID tag 10, it may transmit its own signal (referred to herein as a "control signal") to control an electronic device. For example, FIG. 2 shows a RFID-based control system for controlling an electronic device 20 that is illustrated as an audio-visual device (e.g., a DVD player). As will be described in greater detail herein, the electronic device 20 of FIG. 2 is merely exemplary, and RFID-based control systems according to the present disclosure may be used to control a wide variety of electronic devices.

In the embodiment of FIG. 2, a plurality of interactive RFID tags 22a-22d are provided, with each having a different RFID chip. The RFID chip of a first RFID tag 22a may be configured such that an input signal generated by the tag 22a, after the tag receives energy from the RFID reader (when a user interacts with its switch) will cause the RFID reader 18 to control the electronic device 20 to perform a "rewind" operation. The RFID chip of a second RFID tag 22b may be configured such that a modified, input signal generated by the tag 22b (when a user interacts with its switch) will cause the RFID reader 18 to control the electronic device 20 to perform a "play" operation. The RFID chip of a third RFID tag 22c may be configured such that an input signal generated by the tag 22c (when a user interacts with its switch) will cause the RFID reader 18 to control the electronic device 20 to perform a "fast forward" operation. The RFID chip of a fourth RFID tag 22d may be configured such that an input signal generated by the tag 22d (when a user interacts with its switch) will cause the RFID reader 18 to control the electronic device 20 to perform a "pause" operation. Different or additional interactive RFID tags (e.g., a "stop" or an "on/off" tag) may also be provided without departing from the scope of the present disclosure.

In the embodiment illustrated in FIG. 2, each tag 22a-22d is provided with printed information that is indicative of the input signal to be transmitted by its antenna when its switch is actuated. For example, the first tag 22a (which results in the electronic device 20 performing a "rewind" operation, when actuated) may be provided with printed information constituting the word "rewind" or a symbol suggestive of that function. Similarly, the second tag 22b may be provided with printed information constituting the word "play" (or a symbol to that effect), the third tag 22c may be provided with printed information constituting the word "fast forward" (or a symbol to that effect), and the fourth tag 22d may be provided with printed information constituting the word "pause" (or a symbol to that effect).

In the illustrated embodiment, one or more of the tags 22a-22d is configured to be removably securable to a variety of surfaces. For example, the tags 22a-22d may be secured directly to the electronic device 20 when it is first installed or incorporated into the control system. From there, the tags 22a-22d may remain on the electronic device 20 or may be removed therefrom and removably secured to a different surface, such as the top surface of a table 24, as shown in FIG. 2.

Figure 4:
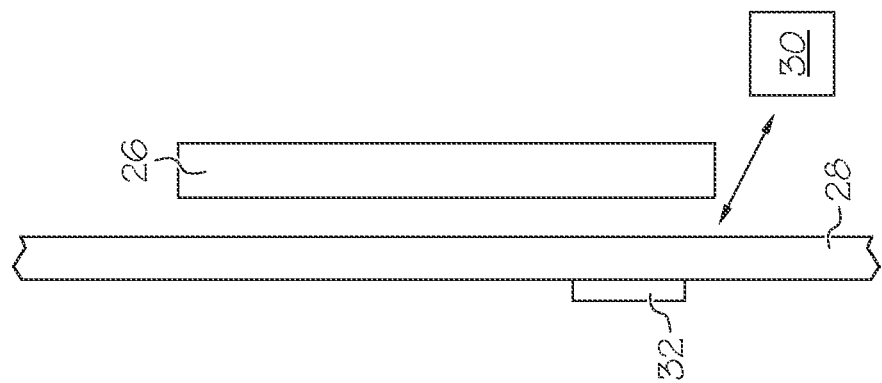
FIGS. 3 and 4 illustrate an electronic graphic display device incorporating RFID devices of the type shown in FIG. 1.
Figure 3:
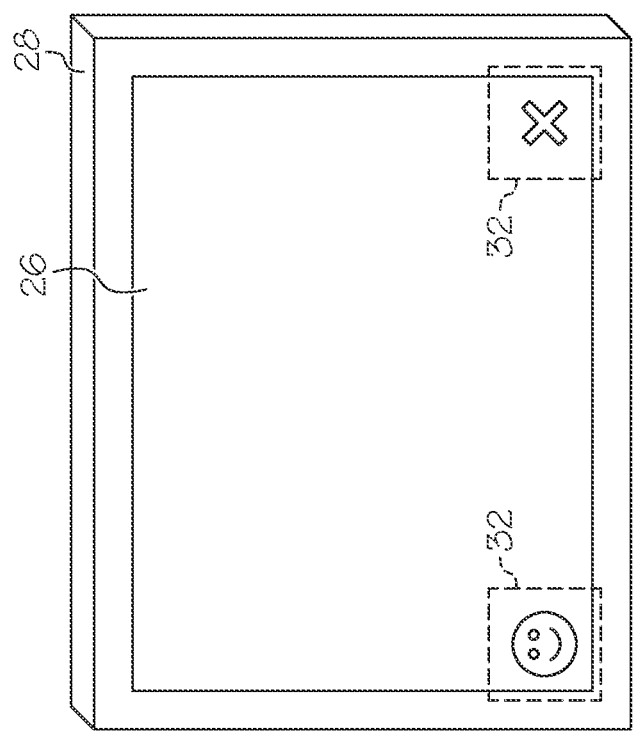

In another embodiment, the electronic device controlled by an RFID-based control system is a graphic display device (e.g., a television or computer screen or monitor), as shown in FIGS. 3-6. In the embodiment of FIGS. 3 and 4, an RFID-based control system includes a graphic display device 26, a transparent surface or separator or divider 28, an RFID reader 30 (FIG. 4), and plurality of interactive RFID tags 32. As best shown in FIG. 4, the transparent surface 28 (which may be glass or a window) is positioned in front of the graphic display device 26, with the tags 32 fixedly or removably secured to the outer face of the transparent surface 28 (i.e., on the side opposite the graphic display device 26). The RFID reader 30 may be positioned anywhere within range of the tags 32, but in the illustrated embodiment is oriented on the same side of the transparent surface 28 as the graphic display device 26 (e.g., the backside). Such a configuration may be advantageous in point-of-sale displays, where it is desirable to allow a customer to interact with the graphic display device 26 without having direct physical contact with it.

Interacting with the tags 32 may result in a variety of different control functions. For example, one tag 32 may be configured to transmit an input signal that results in the RFID reader 30 controlling the graphic display device 26 to show a commercial or demonstration, while another tag 32 is configured to transmit an input signal that results in the RFID reader 30 controlling the graphic display device 26 to stop showing the commercial or demonstration. As shown in FIG. 3, the RFID tags 32 may include printed information (as shown) that is indicative of the signal transmitted by the tag when its switch has been actuated. Additionally, the RFID tags 32 may be, as far as practicable, generally or substantially transparent or translucent, with the switch comprising a transparent conductor and the antenna and chip being relatively thin and unobtrusive.

In the embodiment of FIGS. 5 and 6, the control system includes a screen or surface 34 onto which an image may be projected, an RFID reader 36, and at least one interactive RFID tag 38 fixedly or removably secured to the screen 34. Rather than employing a separate display device, an image may be directly projected onto the tag 38 and/or the screen 34 using a projector or other light source. The tag 38 may be generally or substantially transparent or translucent, as described above with respect to the embodiment of FIGS. 3 and 4, so as to not obscure the projected image.

Interacting with the tag 38 may result in a variety of different control functions. For example, the tag 38 may be configured to transmit an input signal that results in the RFID reader 36 controlling the projector or light source to change the image displayed on the tag 38 and/or the screen 34. In another example, the image projected on the tag 38 may ask a viewer to press the tag 38 for more information about a product or service. When the viewer presses the tag 38, it may transmit an input signal that results in the RFID reader 30 controlling a host system to transmit data (e.g., via Bluetooth® functionality) to the viewer's telephone.

FIG. 7 shows an RFID-based control system for controlling an electronic gaming device 40. The control system includes the device 40, an RFID reader 42, and a plurality of interactive RFID tags 44a-44d. The system may further include a remote control 46 onto which the tags 44a-44d may be fixedly or removably secured. The tags 44a-44d serve the same function as the buttons on a traditional remote control, in that they are pressed to control various aspects of the gaming device 40 (e.g., movement of an icon on a display screen). It may be advantageous for the tags 44a-44d to be removably or at least adjustably secured to the remote control 46, as such a configuration allows a user to modify the layout of the tags 44a-44d, thereby customizing the controls to their preferred arrangement. The tags 44a-44d could even be removed from the remote control 46 and placed on other surfaces. This could allow for functionality that is impossible with traditional remote controls, such as by dispersing the tags 44a-44d throughout a gaming area to allow different users to simultaneously control aspects of the gaming device 40.

Figure 8:
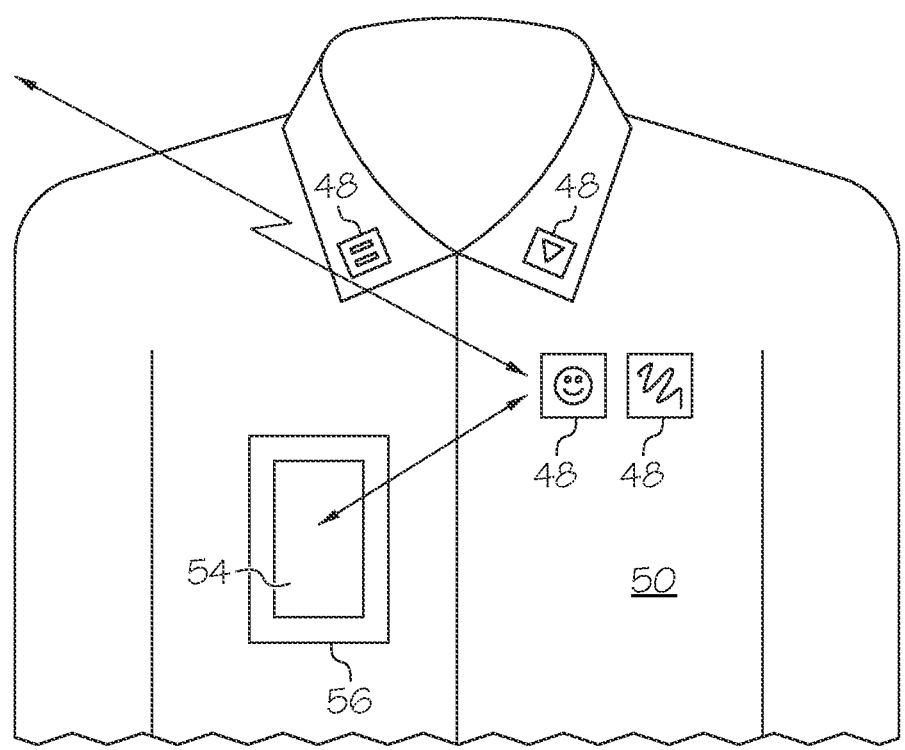
FIG. 8 is a front elevational view of an article of clothing incorporating RFID devices of the type shown in FIG. 1.
Figure 9:
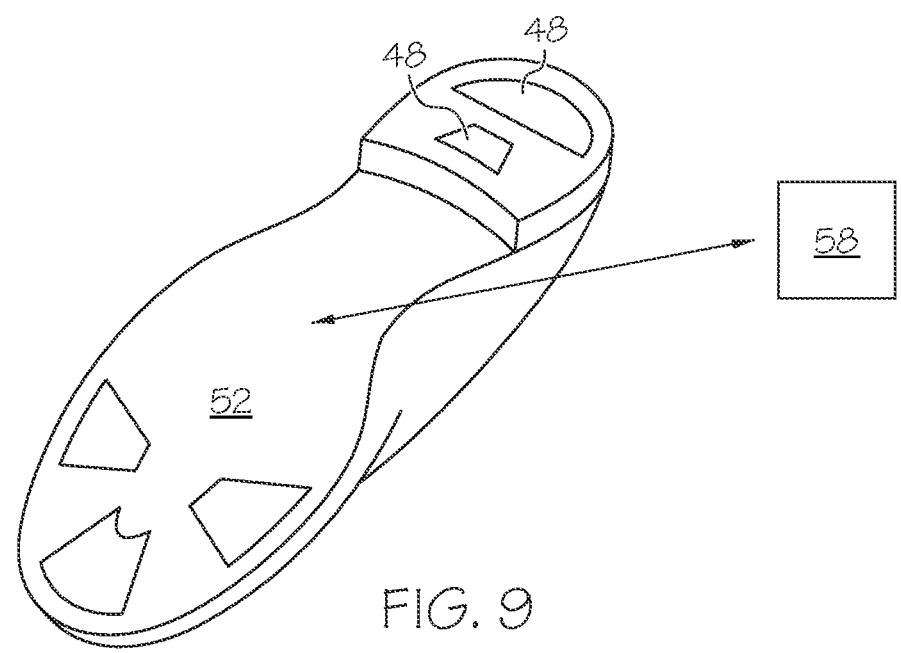
FIG. 9 is a perspective view of an alternative article of clothing incorporating RFID devices of the type shown in FIG. 1.

FIGS. 8 and 9 show additional uses for interactive RFID tags according to the present disclosure. In the embodiments of FIGS. 8 and 9, RFID tags 48 are incorporated into an article of clothing, such as a shirt 50 (FIG. 8) or a shoe 52 (FIG. 9). The tags 48 may be incorporated into the clothing by any suitable means, such as (but not limited to) being sown to a portion of a shirt 50 or embedded within the sole or side of a shoe 52 or secured by adhesive. The tags 48 may have predefined functions when their switches are actuated or be customized by a user to perform particular functions, and may interact with a local reader system 54 (as in FIG. 8, where the RFID reader 54 is carried in a pocket 56 of the shirt 50 or elsewhere on the person of the user) or a remote RFID reader 58 (as in FIG. 9).

Figure 10:
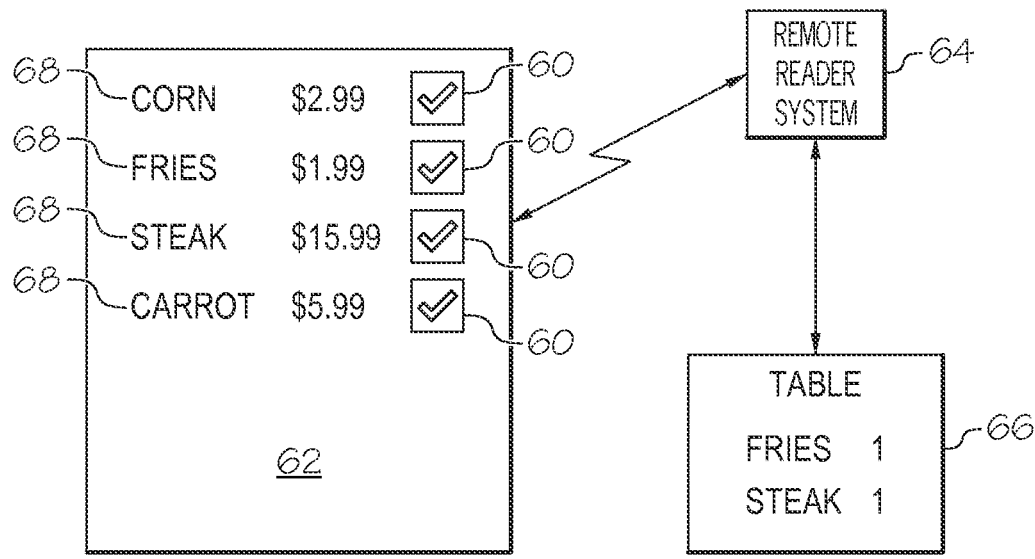
FIG. 10 is a schematic diagram of a menu system incorporating RFID devices of the type shown in FIG. 1.

In an application illustrated in FIG. 10, RFID tags 60 according to the present disclosure may be incorporated into an order-placement interface unit for selecting and recording and/or transmitting order-generating information. Examples of applications in which such an order-placement arrangement can be employed include an inventory management system (e.g., for remotely ordering additional units of an out-of-stock item) or a restaurant menu card 62. In the example of a restaurant menu card 62, the control system may further include an RFID reader 64 and an electronic device 66 that may comprise a display that is readable by suitable personnel, such restaurant employees, or by an order-generating device. The menu card 62 or other order-placement interface may include printed information, such as a plurality of menu items 68, each having an associated tag 60. In this illustrated embodiment, the user presses the tag 60 associated with a particular menu item to send an input signal to the reader 64. The reader 64 then sends a control signal to the electronic device 66 to add the menu item to the user's order. Other interactive tags may also be incorporated into the menu card 62 or the like, such as a tag that confirms the order or requests the presence of an employee when its switch is actuated.

Other applications are also possible with interactive tags according to the present disclosure. For example, an interactive RFID tag could be placed in a location convenient for a patient in a hospital or person with limited mobility to call for assistance. In one specific embodiment of such a system, one or more tags could be at or near floor level, in areas where a patient or elderly or infirm person may fall, allowing him or her to summon assistance by pressing the switch of the tag. As tags of this type may be relatively low cost, passive devices, they may be placed for extended periods of time in locations that are relatively inaccessible under normal circumstances (such as under, on, or behind a piece of furniture), but easily accessible by somebody who has fallen.

Figure 11:
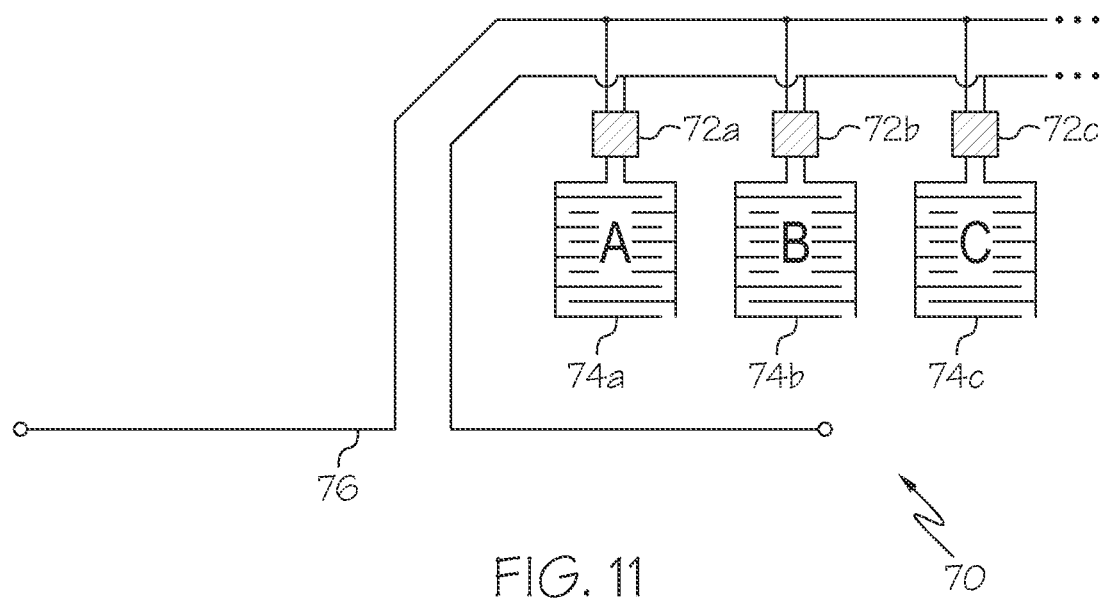
FIG. 11 a schematic diagram of a keyboard incorporating RFID technology according to the present disclosure.

In yet another example, an array of interactive RFID tags may be applied to a surface or remote control to define a wireless keyboard or data-entry device. Each tag may be provided with printed information corresponding to a letter, number, or symbol of a typical keyboard or data-entry device. FIG. 11 shows a portion of a modified version of such a wireless keyboard or data-entry device 70, which employs a plurality of RFID chips 72a-72c and associated switches 74a-74c, but a single antenna 76 associated with all of the chips 72a-72c could be provided. Each illustrated switch includes printed information corresponding to a letter (i.e., "A" for the first switch 74a, "B" for the second switch 74b, and "C" for the third switch 74c), which tells a user that pressing the switch will result in the antenna 76 transmitting an input signal that causes an RFID reader (not illustrated) to control an electronic device to generate that particular letter on a display or enter that letter in a data-entry location. Associating multiple chips and switches with a single antenna may be advantageous in decreasing the cost of the resulting keyboard or data-entry device 70 but, as noted above, it is also within the scope of the present disclosure to provide a keyboard or data-entry device incorporating a plurality of individual interactive RFID tags each having its own antenna. Employing a plurality of self-contained RFID tags may be advantageous in increasing the flexibility of the resulting keyboard or data-entry device, making it easier to rearrange the tags into an orientation that is preferred by the user.

Figure 12:
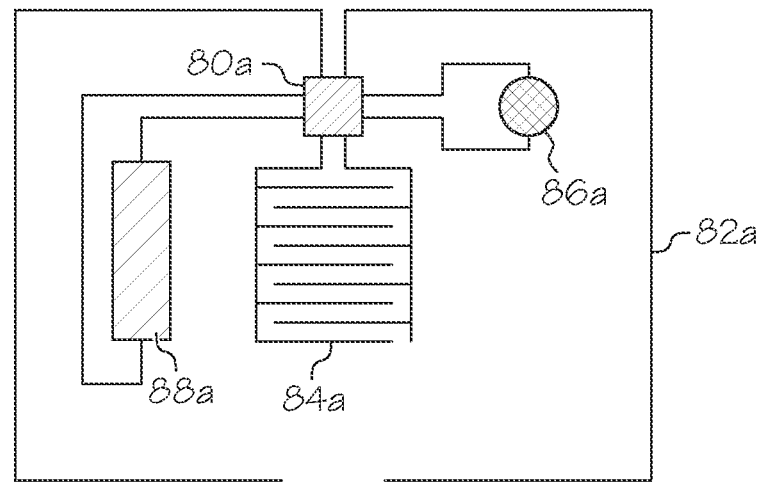
FIGS. 12 and 13 are schematic diagrams of RFID devices of the type shown in FIG. 1, including indicator elements.
Figure 13:
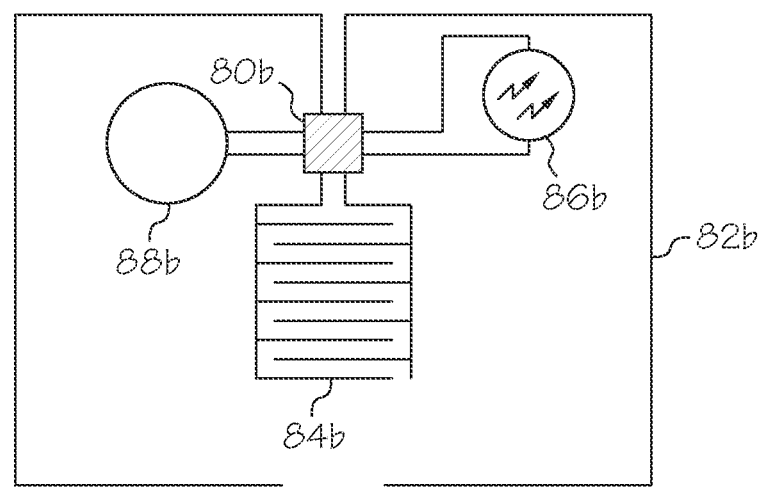

In another aspect of the present disclosure, an interactive RFID tag may be provided with an indicator component or element that confirms to a user that the switch of the tag has been successfully actuated. For example, FIGS. 12 and 13 show RFID tags 78a and 78b with RFID chips 80a and 80b (respectively) and associated antennae 82a and 82b (respectively) and switches 84a and 84b (respectively). The illustrated tags 78a and 78b further include indicator elements 86a and 86b (respectively) and power sources 88a and 88b electrically connected to the associated chip 80a, 80b. The power sources 88a and 88b drive the associated indicator elements 86a and 86b, which are actuated by manipulation of the associated switch 84a, 84b. Alternatively, rather than providing built-in power sources 88a and 88b, it is also within the scope of the present disclosure for the indicator elements to be passive devices, which may be driven by energy from an external source (e.g., a separate RFID reader).

The nature of the indicator elements 86a and 86b may vary. For example, the indicator element 86a, 86b may be an optical indicator (e.g., an LED or LCD or electrophoretic display element or other light source) that responds to actuation of the associated switch 84a, 84b by emitting a light. A user viewing the light will know that the switch 84a, 84b has been successfully manipulated. In another embodiment, the indicator element 86a, 86b may be a tactile indicator (e.g., a motion- or vibration-emitting element or a piezoelectric or electroactive polymer material that can change surface texture) that responds to actuation of the associated switch 84a, 84b by generating motion or a change in texture. A user feeling the motion or change in texture will know that the switch 84a, 84b has been successfully manipulated. In yet another embodiment, the indicator element 86a, 86b may be an audible indicator that responds to actuation of the associated switch 84a, 84b by emitting a sound. A user hearing the sound will know that the switch 84a, 84b has been successfully manipulated. These various indicator elements are merely exemplary and other types of indicator elements and alerts may be employed without departing from the scope of the present disclosure. Furthermore, RFID tags according to the present disclosure are not limited to the use of a single indicator element, but rather each tag may include two or more built-in indicator elements of the same or different types (e.g., two light-emitting indicators or a vibrating indicator and a sound-emitting indicator).

Figure 14:
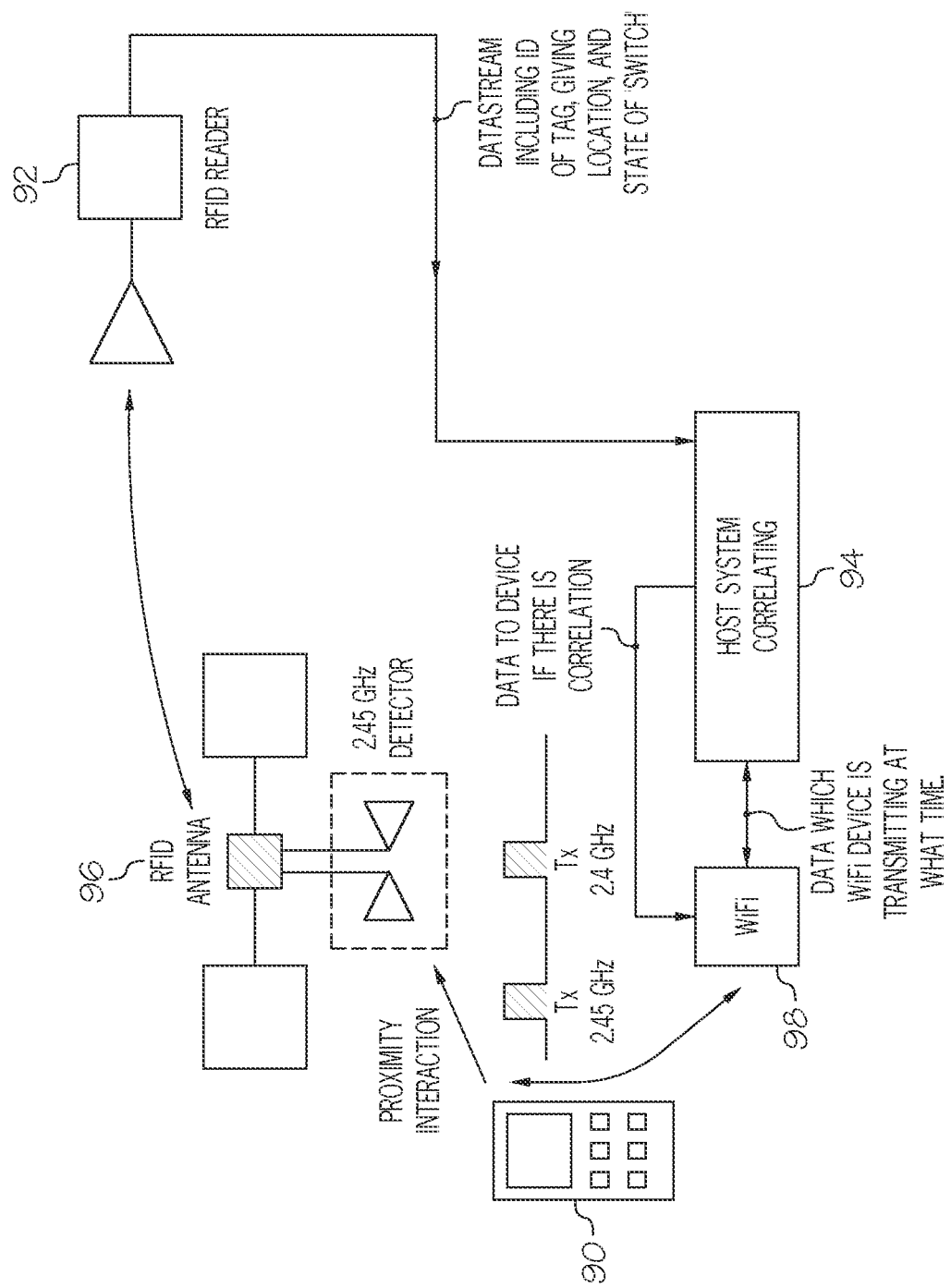
FIG. 14 a schematic diagram of a system for practicing the present invention.

Reference is now made to FIG. 14. By detecting the interaction with a phone or other device 90, a reader system 92 is able to localize that interaction with great accuracy; if the interaction being detected is, for example, the phones 90 Wi-Fi emission, by correlating the knowledge from the Wi-Fi system of when a particular phone is transmitting, or the channel, or interacting with the phone 90 in such as way that the emission is controlled, for example temporarily disabling the transceiver, and observing the switch status of the RFID tag, it is possible for the system to determine which phone is interacting with the RFID tag, and direct media such as video or images to that phone associated with that interaction from the host system 94. One embodiment of such a system is shown in FIG. 14. An alternate embodiment uses information from the RFD reader 92 about the location of the tag 96 as the location mechanism, for example a phase array reader system mounted in the ceding of the store can locate the tag 96. A further embodiment uses a phased array antenna or other positioning system detecting the Wi-Fi 98 emission from the phone 90, and determining that it is local to the RFID tag 96, and, since the RFID tag 96 has changed state, the phone 90 must be in proximity to the tag 96. Essentially the Wi-Fi location based system establishes the coarse position, and the tag 96 interaction the fine position, preventing activation of marketing messages when a person carrying a phone simply walks by an interactive point.

The objective of the embodiment shown in FIG. 14 would be to provide an alternative to NFC which works with all phones (including iPhone®, that does not have NFC) in a retail environment, for consumers to place their phone in proximity to a low cost tag positioned either on a product or on the display stand holding the product, and receive information, such as video, sound, images or special offers for marketing associated with the product.

Using the RFID as the mechanism for monitoring the proximity interaction from the user is low cost method of achieving this function, in comparison to wiring, and potentially, dependent on the method used, may provide a mechanism that works with all phones rather than just NFC enabled devices.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof including as combinations of features that are individually disclosed or claimed herein.

The invention claimed is:

1. An RFID-based control system for controlling an electronic device, comprising:
   an RFID reader configured to transmit a control signal to the electronic device upon receiving an input signal; and
   a plurality of transparent RFID tags, each of the plurality of transparent RFID tags comprising:
      an RFID chip,
      an antenna electrically connected to the RFID chip, and
      a built-in indicator that responds to actuation of an interactive switch by generating motion or a change in texture; and
      the interactive switch electrically connected to the RFID chip, wherein the antenna is configured to transmit a return input or modified signal to the RFID reader when a user physically interacts with the interactive switch after the RFID reader has polled the RFID tag such that the interactive switch is adapted to detect interaction with the user by detecting a high frequency or an ultrahigh frequency electromagnetic emission, and each RFID tag is configured to be removeably securable to the electronic device.

2. The RFID-based control system of claim 1, wherein the electronic device comprises an electronic audio-visual device.

3. The RFID-based control system of claim 1, wherein the electronic device comprises an electronic graphic display device.

4. The RFID-based control system of claim 1, wherein the electronic device comprises an electronic gaming device.

5. The RFID-based control system of claim 1, further comprising an article of clothing incorporating one or more of the plurality of RFID tags.

6. The RFID-based control system of claim 1, further comprising an order-placement interface unit incorporating one or more of the plurality RFID tags.

7. The RFID-based control system of claim 6, wherein the order-placement interface unit comprises a menu card.

8. The RFID-based control system of claim 1, wherein the plurality of transparent RFID tags comprise an array of RFID tags configured as a keyboard.

9. The RFID-based control system of claim 1, wherein the RFID-based control system further comprises a light source configured to illuminate at least a portion of a surface behind one or more of the plurality of RFID tags.

* * * * *